United States Patent
Yang et al.

(10) Patent No.: US 11,296,264 B2
(45) Date of Patent: Apr. 5, 2022

(54) LIGHT SOURCE MODULE

(71) Applicant: Coretronic Corporation, Hsin-Chu (TW)

(72) Inventors: Wen-Hsun Yang, Hsin-Chu (TW); Yu-An Huang, Hsin-Chu (TW); Shih-Yi Lin, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/921,877

(22) Filed: Jul. 6, 2020

(65) Prior Publication Data

US 2021/0020812 A1    Jan. 21, 2021

Related U.S. Application Data

(60) Provisional application No. 62/874,508, filed on Jul. 16, 2019.

(30) Foreign Application Priority Data

May 18, 2020    (CN) .......................... 202020824525.8

(51) Int. Cl.
*H01L 33/54*        (2010.01)
*H01L 33/60*        (2010.01)
*H01L 25/075*       (2006.01)

(52) U.S. Cl.
CPC .............. *H01L 33/54* (2013.01); *H01L 33/60* (2013.01)

(58) Field of Classification Search
CPC ... H01L 33/54; H01L 33/60; G02F 1/133605; G02F 1/133603; G02F 1/133607;
(Continued)

(56) References Cited

U.S. PATENT DOCUMENTS

2011/0050558 A1 * 3/2011 Park ................... G02F 1/133603
                                                    345/102
2019/0063723 A1   2/2019 Yamada
(Continued)

FOREIGN PATENT DOCUMENTS

TW    200818551    4/2008
TW    201351710    12/2013

*Primary Examiner* — Marcos D. Pizarro
*Assistant Examiner* — Antonio B Crite
(74) *Attorney, Agent, or Firm* — JCIPRNET

(57) ABSTRACT

The disclosure provides a light source module including a substrate, multiple light-emitting elements, multiple reflecting elements, and an encapsulation layer. The reflecting elements and light-emitting elements are disposed in stack arrangement in the direction perpendicular to the substrate surface, respectively. The encapsulation layer disposed between the reflecting elements and light-emitting elements includes multiple first grooves and main portions. The first grooves located between the light-emitting elements are connected to each other. The main portions cover the light-emitting elements, and the reflecting elements and the light-emitting elements are disposed in the central position of the main portions having multiple first inclined ridges disposed around the central position to define the first grooves in the first direction parallel to the extending direction of the substrate surface. The first angle included between the first inclined ridge and the surface of the substrate is less than 90 degrees.

11 Claims, 10 Drawing Sheets

(58) Field of Classification Search
CPC .. G02B 6/0038; G02B 6/0036; G02B 6/0023; G02B 6/0055; G02B 6/0021
See application file for complete search history.

(56) References Cited

U.S. PATENT DOCUMENTS

2019/0324184 A1    10/2019   Cai et al.
2021/0181577 A1*   6/2021   Zha ................... G02F 1/133606

* cited by examiner

LIGHT SOURCE MODULE

CROSS-REFERENCE TO RELATED APPLICATION

This application claims the priority benefit of U.S. provisional application Ser. No. 62/874,508, filed on Jul. 16, 2019, and China application serial no. 202020824525.8, filed on May 18, 2020. The entirety of each of the above-mentioned patent applications is hereby incorporated by reference herein and made a part of this specification.

BACKGROUND

Technical Field

The disclosure relates to a backlight module, and particularly to a light source module.

Description of Related Art

With increasing applications of non-self-luminous display devices, such as liquid crystal display devices, the design of backlight modules also needs to be adjusted for different applications. In order to meet the display requirements of large size, high dynamic range (HDR), and high contrast, a backlight module needs to be equipped with the local dimming function. Therefore, direct-lit backlight modules using light-emitting diodes as the main light source have gradually become the mainstream in the market. Because the overall thickness of such backlight modules is relatively thin (e.g., the optical distance is less than 10 mm), the light-emitting diodes are usually covered by an encapsulation layer having a light-emitting structure to uniformly emit light through the light-emitting surface of the backlight module. However, traveling of a portion of the light emitted from the light-emitting diodes in the encapsulation layer, the light is still transmitted laterally (e.g., perpendicular to the light emitting direction) to an adjacent or farther light source (i.e., another light-emitting diode) area through multiple times of total internal reflection in the encapsulation layer, causing an edge halo effect on the periphery of the light emitting area of the light-emitting diode and thus blurring the displayed image (e.g., the contour of the displayed image) and deteriorating the overall display quality (e.g., display contrast). Therefore, how to ensure the light uniformity of the ultra-thin direct-lit backlight module is now one of the issues on which relevant researchers have been working.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The disclosure provides a light source module featuring with good light uniformity.

In order to achieve one, some, or all of the above objectives, an embodiment of the disclosure provides a light source module. The light source module includes a substrate, a plurality of light-emitting elements, a plurality of reflecting elements, and an encapsulation layer. The plurality of light-emitting elements are disposed on a surface of the substrate. The plurality of reflecting elements and the plurality of light-emitting elements are disposed in stack arrangement respectively in a direction perpendicular to the surface of the substrate. The encapsulation layer is disposed between the plurality of reflecting elements and the plurality of light-emitting elements and includes a plurality of first grooves and a plurality of main portions. The plurality of first grooves are located between the plurality of light-emitting elements, and the plurality of first grooves are connected to each other. The plurality of main portions cover the plurality of light-emitting elements, and the reflecting element and the light-emitting element are disposed in a central position of the main portion. The main portion has a plurality of first inclined ridges disposed around the central position to define a plurality of first grooves in a first direction. The first direction is parallel to an extending direction of the surface of the substrate. A first angle included between the first inclined ridge and the substrate surface is less than 90 degrees.

Based on the above, in the light source module of an embodiment of the disclosure, the main portion of the encapsulation layer is disposed between the light-emitting element and the reflecting element, and the light-emitting element and the reflecting element are disposed in the central position of the main portion. With the plurality of first inclined ridges around the central position of the main portion and the angle included between the first inclined ridge and the surface of the substrate being less than 90 degrees, the light emitted by the light-emitting element can be prevented from being laterally transmitted from the predetermined light emitting area to another main portion (or another light-emitting element), which results in overlapping with the light emitting area of the another main portion (or another light emitting element). Accordingly, the edge halo effect generated on the periphery of the light emitting area can be suppressed. In other words, the light uniformity of each main portion of the light source module is facilitated, and, as a result, the light uniformity and the image contrast of the display device including the light source module is also facilitated.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
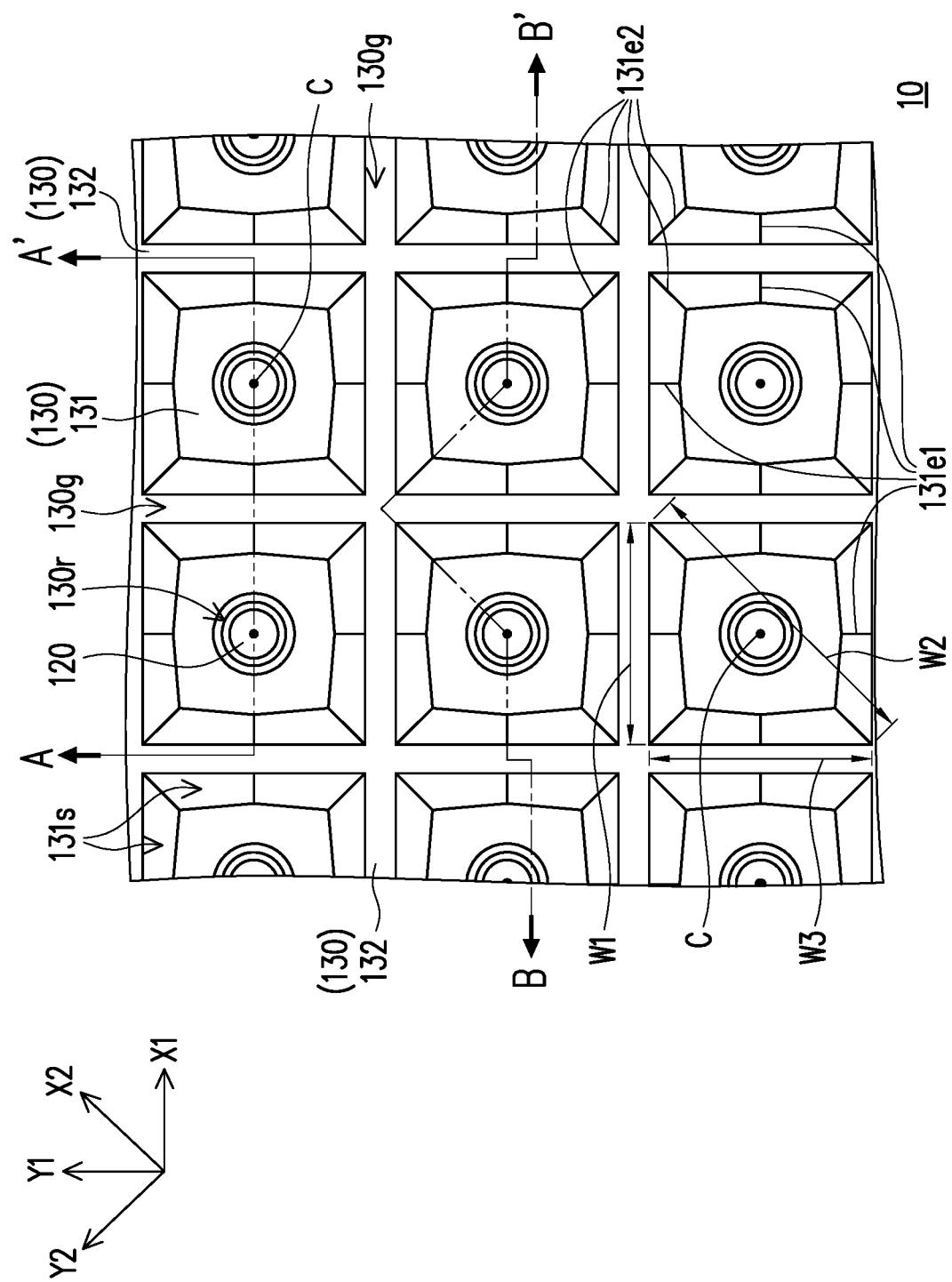
FIG. 1 is a schematic top view of a light source module according to the first embodiment of the disclosure.
Figure 2:
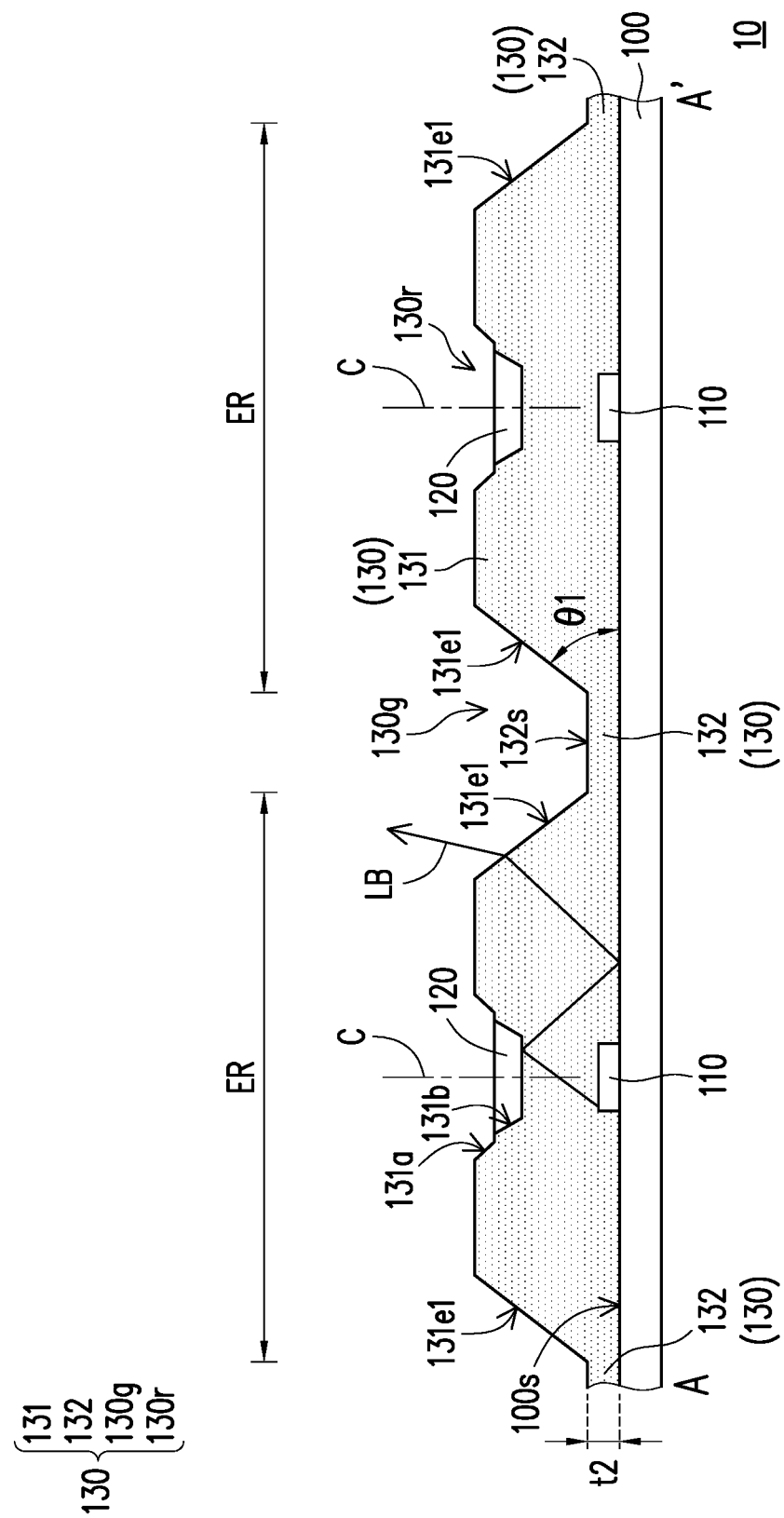
FIG. 2 is a schematic cross-sectional view of the light source module of FIG. 1 taken along a line A-A'.
Figure 3:
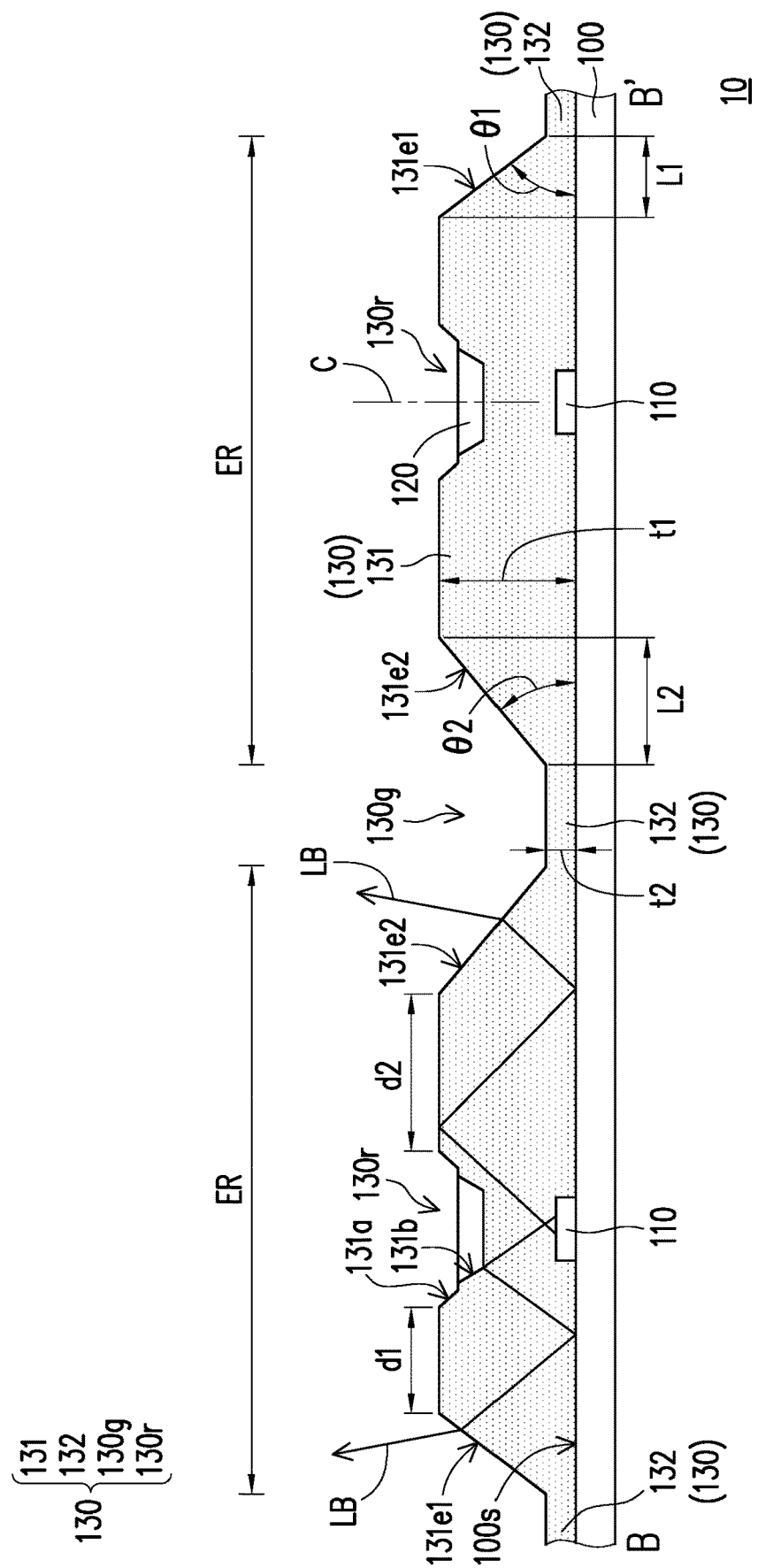
FIG. 3 is a schematic cross-sectional view of the light source module of FIG. 1 taken along a line B-B' of FIG. 1.

FIG. 1 is a schematic top view of a light source module according to the first embodiment of the disclosure. FIG. 2 is a schematic cross-sectional view of the light source module of FIG. 1 taken along a line A-A'. FIG. 3 is a schematic cross-sectional view of the light source module of FIG. 1 taken along a line B-B'. In particular, a substrate 100 shown in FIG. 2 and FIG. 3 is omitted in FIG. 1.

Referring to FIG. 1, FIG. 2, and FIG. 3, a light source module 10 includes a substrate 100, a plurality of light-emitting elements 110, a plurality of reflecting elements 120, and an encapsulation layer 130. The plurality of light-emitting elements 110 are disposed on a surface 100s of the substrate 100. The plurality of reflecting elements 120 are respectively overlapped with the plurality of light-emitting elements 110 in a direction perpendicular to the surface 100s of the substrate 100. The encapsulation layer 130 is disposed between the plurality of reflecting elements 120 and the plurality of light-emitting elements 110. In detail, the encapsulation layer 130 includes a plurality of main portions 131 and a plurality of first grooves 130g. The plurality of main portions 131 respectively cover the plurality of light-emitting elements 110. The plurality of first grooves 130g are located between the light-emitting elements 110 and are connected to each other. In particular, the orthogonal projections of the plurality of main portions 131 of the encapsulation layer 130 on the surface 100s of the substrate 100 define a plurality of light emitting areas ER of the light source module 10.

More specifically, in the embodiment, the plurality of main portions 131 of the encapsulation layer 130 are disposed on the surface 100s of the substrate 100 in an array arrangement, and the plurality of main portions 131 may define the plurality of first grooves 130g. For example, the first grooves 130g and the main portions 131 of the encapsulation layer 130 may be alternately disposed in the direction X1 and the direction Y1 (e.g., perpendicular to the direction X1), but the disclosure is not limited thereto. In other embodiments, the first grooves 130g and the main portions 131 of the encapsulation layer 130 may be alternately disposed in another direction. For example, the plurality of main portions 131 of the encapsulation layer 130 may also be disposed in a honeycomb arrangement (not shown) on the substrate 100.

In the embodiment, the main portion 131 has a width W1 and a width W2 in a direction X1 and a direction X2, respectively, and the width W1 is less than the width W2, but the disclosure is not limited thereto. In other embodiments, such as when the contour of the orthogonal projection of the main portion on the surface 100s of the substrate 100 is honeycomb-shaped, the width W1 and width W2 of the main portion 131 in the direction X1 and the direction X2 may also be equal. On the other hand, in the embodiment, the main portion 131 has a width W3 in the direction Y1, and the width W3 is substantially equal to the width W1. That is, in the embodiment, the contour of the orthogonal projection of the main portion 131 on the surface 100s of the substrate 100 is substantially square, but the disclosure is not limited thereto.

Furthermore, the main portion 131 has a central position C, and the central position C is provided with the light-emitting element 110 and the reflecting element 120 (e.g., the light-emitting element 110 and the reflecting element 120 are overlapped with the central position C in the direction perpendicular to the surface 100s of the substrate 100). In the embodiment, the main portion 131 has a symmetrical configuration with respect to the central position C. For example, the main portion 131 may be rotationally symmetrical (e.g., when the rotation angle is 90 degrees, 180 degrees, or 270 degrees) by adopting a rotation axis passing through the central position C and perpendicular to the surface 100s of the substrate 100 as its rotation center, or the main portion 131 may be mirror-symmetrical by adopting a reference plane parallel to the direction X1, X2, Y1, or Y2 and perpendicular to the surface 100s of the substrate 100 as the center. However, the disclosure is not limited thereto. In the embodiment, the angle included between the direction X1 and direction X2 is 45 degrees, and the angle included between the direction Y1 and direction Y2 is 45 degrees, but the disclosure is not limited thereto. In other embodiments, depending on the contour of the orthogonal projection of the main portion 131, the angle included between the direction X1 and direction X2 and the angle included between the direction Y1 and direction Y2 may also be angles of other degrees.

In detail, the main portion 131 has a plurality of first inclined ridges 131e1 and a plurality of second inclined ridges 131e2 disposed around the central position C. In the embodiment, the first inclined ridge 131e1 and the second inclined ridge 131e2 are alternately disposed around the central position C of the main portion 131, and the orthogonal projections of the plurality of inclined ridges (the first inclined ridges 131e1 and the second inclined ridges 131e2) on the surface 100s of the substrate 100 all point to the central position C. In other words, the orthogonal projections of the hypothetical extending lines (not shown) on the surface 100s of the substrate 100 all pass through the central position C. In the embodiment, in the direction perpendicular to the surface 100s of the substrate 100, both the plurality of first inclined ridges 131e1 and the second inclined ridges 131e2 may be the axes of symmetry of the main portion 131, but the disclosure is not limited thereto. Accordingly, the uniformity of beams LB emitted by the light-emitting element 110 after the beams LB exit the corresponding main portion 131 can be increased.

Specifically, the plurality of first inclined ridges 131e1 may define the plurality of first grooves 130g of the encapsulation layer 130 in the direction X1 (may be the first direction) and the direction Y1 (may be the first direction) respectively, and the plurality of second inclined ridges 131e2 may define the plurality of first grooves 130g of the encapsulation layer 130 in the direction X2 (may be the second direction) and the direction Y2 (may be the second direction) respectively. The directions X1, X2, Y1, and Y2 intersect each other and are parallel to (the extending direction of) the surface 100s of the substrate 100. In the embodiment, the direction X1 may be perpendicular to the direction Y1, and the direction X2 may be perpendicular to the direction Y2, but the disclosure is not limited thereto.

A first angle θ1 is included between the first inclined ridge 131e1 and the surface 100s of the substrate 100, a second angle θ2 is included between the second inclined ridge 131e2 and the surface 100s of the substrate 100, and the first angle θ1 and the second angle θ2 are both less than 90 degrees. Accordingly, when the beam LB emitted by the light-emitting element 110 is transmitted to the first inclined ridge 131e1 or the second inclined ridge 131e2 of the main portion 131 via total internal reflection of the encapsulation layer 130, the beam LB may be refracted out of the main portion 131 of the encapsulation layer 130 without being transmitted to the main portion 131 corresponding to the adjacent light-emitting element 110. Therefore, the edge halo effect of the beam LB generated on the periphery of the predetermined light emitting area ER can be effectively suppressed, and, as a result, the uniformity of the light emitted by the light-emitting element 110 through the corresponding main portion 131 can be facilitated. That is, the light uniformity of each main portion 131 in the light source module 10 can be facilitated.

In the embodiment, the second angle θ2 of the second inclined ridge 131e2 may be optionally less than the first angle θ1 of the first inclined ridge 131e1, but the disclosure is not limited thereto. In other embodiments, the second angle θ2 of the second inclined ridge 131e2 may also be equal to the first angle θ1 of the first inclined ridge 131e1. In a preferred embodiment, the first angle θ1 included between the first inclined ridge 131e1 and the surface 100s of the substrate 100 and the second angle θ2 included between the second inclined ridge 131e2 and the surface 100s of the substrate 100 may be both less than 30 degrees, but the disclosure is not limited thereto.

In another aspect, a length L1 (referring to FIG. 3) of the orthogonal projection of the first inclined ridge 131e1 on the surface 100s of the substrate 100 may not be equal to a length L2 of the orthogonal projection of the second inclined ridge 131e2 on the surface 100s of the substrate 100. In the embodiment, the length L1 of the first inclined ridge 131e1 may be less than the length L2 of the second inclined ridge 131e2. Since the distance between the end of the second inclined ridge 131e2 adjacent to the substrate 100 and the central position C of the main portion 131 (or the light-emitting element 110) is greater than the distance between the end of the first inclined ridge 13e1 adjacent to the substrate 100 and the central position C of the main portion 131 (or light-emitting element 110), with the above length relationship between the first inclined ridge 131e 1 and the second inclined ridge 131e2, the difference in the overall light output of the beam LB via the first inclined ridge 131e1 and the second inclined ridge 131e2 can be reduced, and, as a result, the light uniformity of the light-emitting element 110 after exiting the corresponding main portion 131 can be facilitated.

On the other hand, in the embodiment, the encapsulation layer 130 includes a plurality of second grooves 130r. A distance d1 (referring to FIG. 3) in the direction X1 (or the direction Y1) between the end of the first inclined ridge 131e1 away from the substrate 100 (or the first groove 130g) and the second groove 130r may be less than a distance d2 in the direction X2 (or the direction Y2) between the end of the second inclined ridge 131e2 away from the substrate 100 (or the first groove 130g) and the second groove 130r, but the disclosure is not limited thereto. It should be noted that the numbers of the first inclined ridges 131e1 and the second inclined ridges 131e2 in the embodiment are both four as an example for illustration. However, the disclosure shall not be limited to such illustration. In other embodiments, the types and numbers of the inclined ridges with different degrees of inclination (with respect to the surface 100s of the substrate, for example) may also be adjusted according to the optical specifications of the light source module (or backlight module), as long as the inclined ridges (or main portion) are rotationally symmetrical with respect to the central position C.

Furthermore, the main portion 131 may further include a plurality of inclined surfaces 131s (referring to FIG. 1), and the first inclined ridge 131e 1 and the second inclined ridge 131e2 are located on opposite sides of the inclined surface 131s, respectively. In another aspect, the junction of two adjacent inclined surfaces 131s may define one first inclined ridge 131e1 or second inclined ridge 131e2. That is, the inclined surfaces 131s that define the first inclined ridges 131e1 and the second inclined ridges 131e2 are not coplanar with each other. In another aspect, since the first angle θ1 included between the first inclined ridge 131e1 and the surface 100s of the substrate 100 is greater than the second angle θ2 included between the second inclined ridge 131e2 and the surface 100s of the substrate 100, the angle included between the inclined surface 131s connecting the first inclined ridge 131e1 and the second inclined ridge 131e2 and the surface 100s of the substrate 100 gradually decreases in the direction from the first inclined ridge 131e1 toward the second inclined ridge 131e2. In the embodiment, the number of inclined surfaces 131s is eight (e.g., one main portion 131) as an example for illustration. However, the disclosure shall not be construed as being limited to such illustration. According to other embodiments, the number of inclined surfaces may also be adjusted in correspondence with the number of inclined ridges according to the optical specifications of the light source module (or backlight module).

The angles included between the inclined surface 131s and the surface 100s of substrate 100 are all less than 90 degrees. Accordingly, when the beams emitted by the light-emitting element 110 are transmitted to the inclined surfaces 131s of the main portion 131 via total internal reflection of the encapsulation layer 130, the beams may be refracted out of the main portion 131 of the encapsulation layer 130 without being transmitted to the main portion 131 corresponding to the adjacent light-emitting element 110. Therefore, the edge halo effect of the beam generated on the periphery of the predetermined light emitting area ER can be effectively suppressed, and, as a result, the light uniformity of each main portion 131 in the light source module 10 can be facilitated.

The encapsulation layer 130 may further include a plurality of connections 132. The plurality of connections 132 are overlapped with the plurality of first grooves 130g in the direction perpendicular to the surface 100s of the substrate 100 and are connected between the main portions 131. More specifically, the inclined surface 131s, the first inclined ridge 131e1, the second inclined ridge 131e2, and a surface 132s (referring to FIG. 2) of the connection 132 of the main portion 131 may define the first groove 130g of the encapsulation layer 130. However, the disclosure is not limited thereto. According to other embodiments, the connection 132 may be omitted from the encapsulation layer. In the embodiment, a thickness t1 of the main portion 131 in the direction perpendicular to the surface 100s of the substrate 100 is substantially at least three times greater than a thickness t2 of the connection 132 in the direction perpendicular to the surface 100s of the substrate 100. In one embodiment, the thickness t2 of the connection 132 in the direction perpendicular to the surface 100s of the substrate 100 may range from 0.1 cm to 0.4 cm, but the disclosure is not limited thereto. Accordingly, to maintain the process margin, the beams emitted by the light-emitting element 110 can be prevented from being transmitted to the main portion 131 corresponding to the adjacent light-emitting element 110 via the connection 132 to generate the edge halo effect. As a result, the light uniformity of each main portion 131 of the light source module 10 can be further facilitated.

Furthermore, the plurality of second grooves 130r of the encapsulation layer 13 are respectively overlapped with the plurality of light-emitting elements 110 in the direction perpendicular to the surface 100s of the substrate 100, and the plurality of reflecting elements 120 are respectively disposed in the plurality of second grooves 130r. For example, the reflecting element 120 may have a plurality of reflecting particles (not shown), and the material of the reflecting particles includes metal, silicon dioxide, titanium dioxide, or a combination thereof, but the disclosure is not limited thereof. In particular, with the reflecting element 120, the beams LB emitted by the light-emitting element 110 can be laterally transmitted into the main portion 131 of the encapsulation layer 130 and then refracted out of the main portion 131 by means of the inclined surface 131s (or the first inclined ridge 131e 1 and the second inclined ridge 131e2). Accordingly, the light uniformity of the beams LB after exiting the main portion 131 can be facilitated.

In the embodiment, the main portion 131 of the encapsulation layer 130 further has a first side wall 131a and a second side wall 131b that define the second groove 130r, wherein the first side wall 131a allows a portion of the beams LB to pass through, thereby making up for an area without light emission due to the shielding of the reflecting element 120 located in the central position C of the main portion 131. For example, the second groove 130r may have a first part defined by the first side wall 131a and a second part defined by the second side wall 131b, and the reflecting element 120 is disposed at the second part of the second groove 130r, but the disclosure is not limited thereto. The reflecting element 120 has a reflective material (e.g., reflecting particles) inside and may transmit the beam LB via reflection to an area away from the central position C of the main portion 131 to emit light. In other embodiments, a portion of the reflecting element may also be located at the first part of the second groove 130r. In the embodiment, the first side wall 131a and the second side wall 131b of the main portion 131 may not be aligned with each other. That is, the first side wall 131a and the second side wall 131b of the main portion 131 may not be coplanar, but the disclosure is not limited thereto.

The following will list some other embodiments to explain the disclosure in detail, wherein the same components will be labelled with the same reference numerals, and the description of the same technical content will be omitted.

Figure 4:
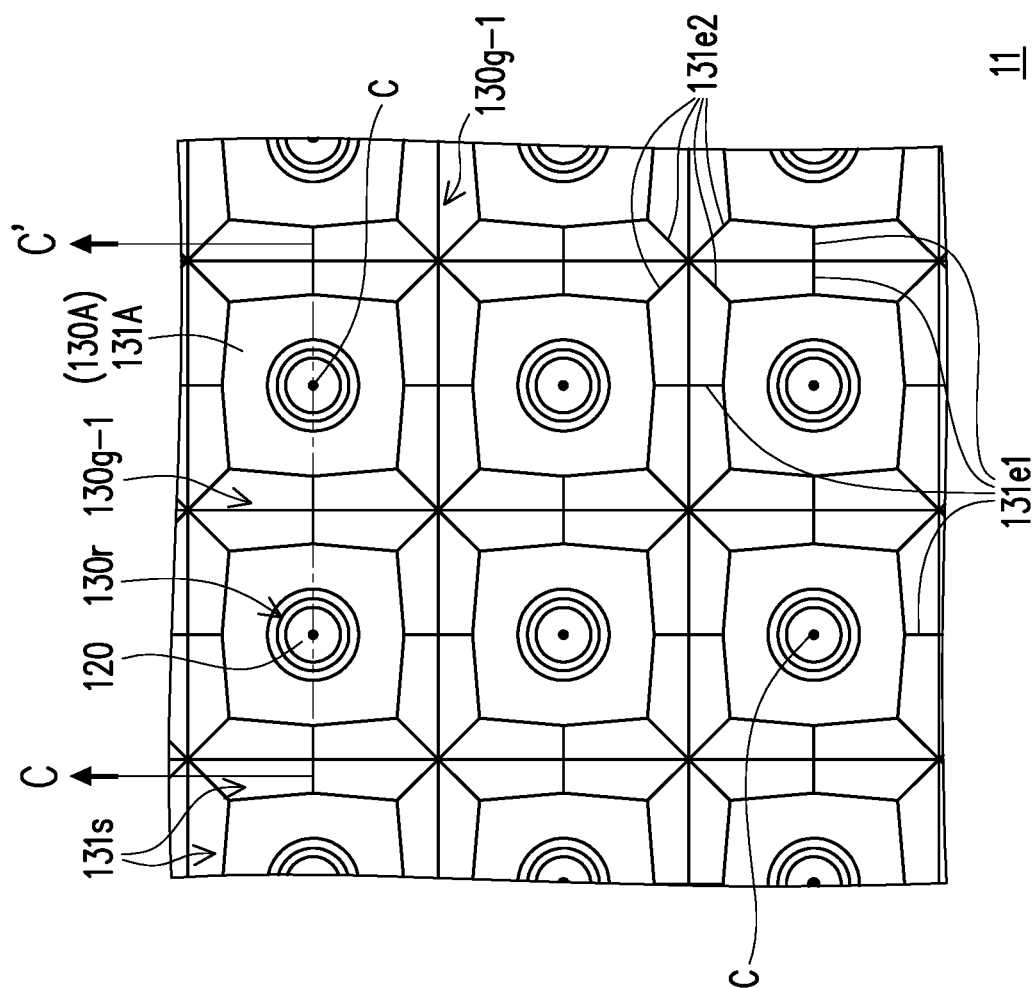
FIG. 4 is a schematic top view of a light source module according to the second embodiment of the disclosure.
Figure 4:
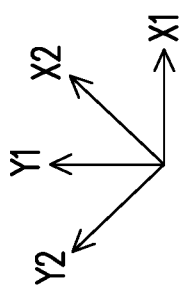
Figure 5:
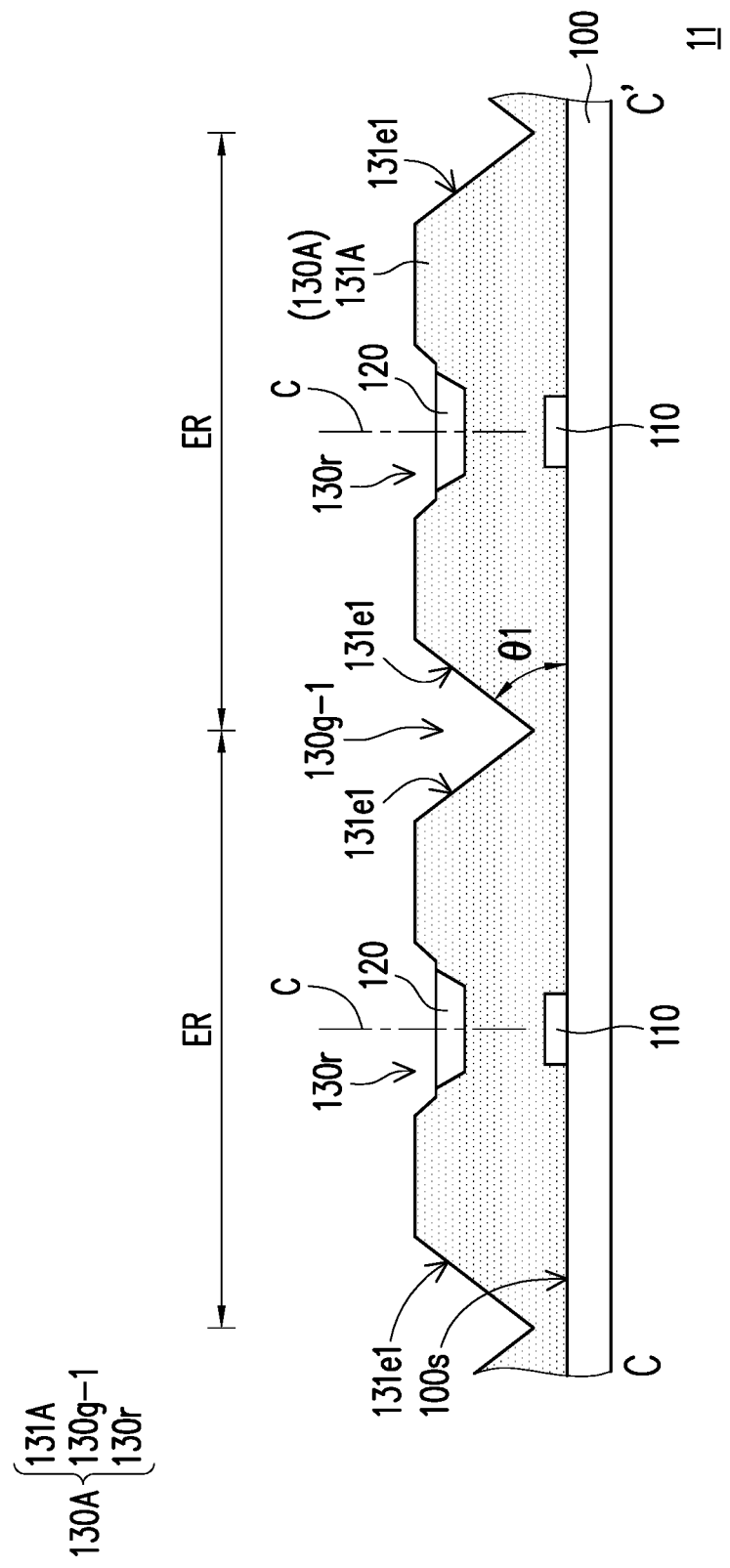
FIG. 5 is a schematic cross-sectional view of the light source module of FIG. 4 taken along a line C-C'.

FIG. 4 is a schematic top view of a light source module according to the second embodiment of the disclosure. FIG. 5 is a schematic cross-sectional view of the light source module of FIG. 4 taken alone a line C-C'. In particular, the substrate 100 of FIG. 5 is omitted in FIG. 4. Referring to FIG. 4 and FIG. 5, the difference between a light source module 11 in the embodiment and the light source module 10 of FIG. 1 is that the structure of the encapsulation layer is different. Specifically, an encapsulation layer 130A of the light source module 11 does not have the connection 132 shown in FIG. 1, and a plurality of main portions 131A of the encapsulation layer 130A are directly connected to each other. In other words, the inclined surface 131s, the first inclined ridge 131e1, and the second inclined ridge 131e2 of the main portion 131A alone may define a first groove 130g-1 of the encapsulation layer 130A.

In the embodiment, the first inclined ridge 131e1, the second inclined ridge 131e2, and the inclined surface 131s connected between the first inclined ridge 131e1 and the second inclined ridge 131e2 of the main portion 131A are similar to those of the main portion 131 of FIG. 1. Therefore, the detailed description of the first inclined ridge 131e1, the second inclined ridge 131e2, and the inclined surface 131s of the main portion 131A has been set forth in the foregoing and thus will not be repeated here.

Figure 6:
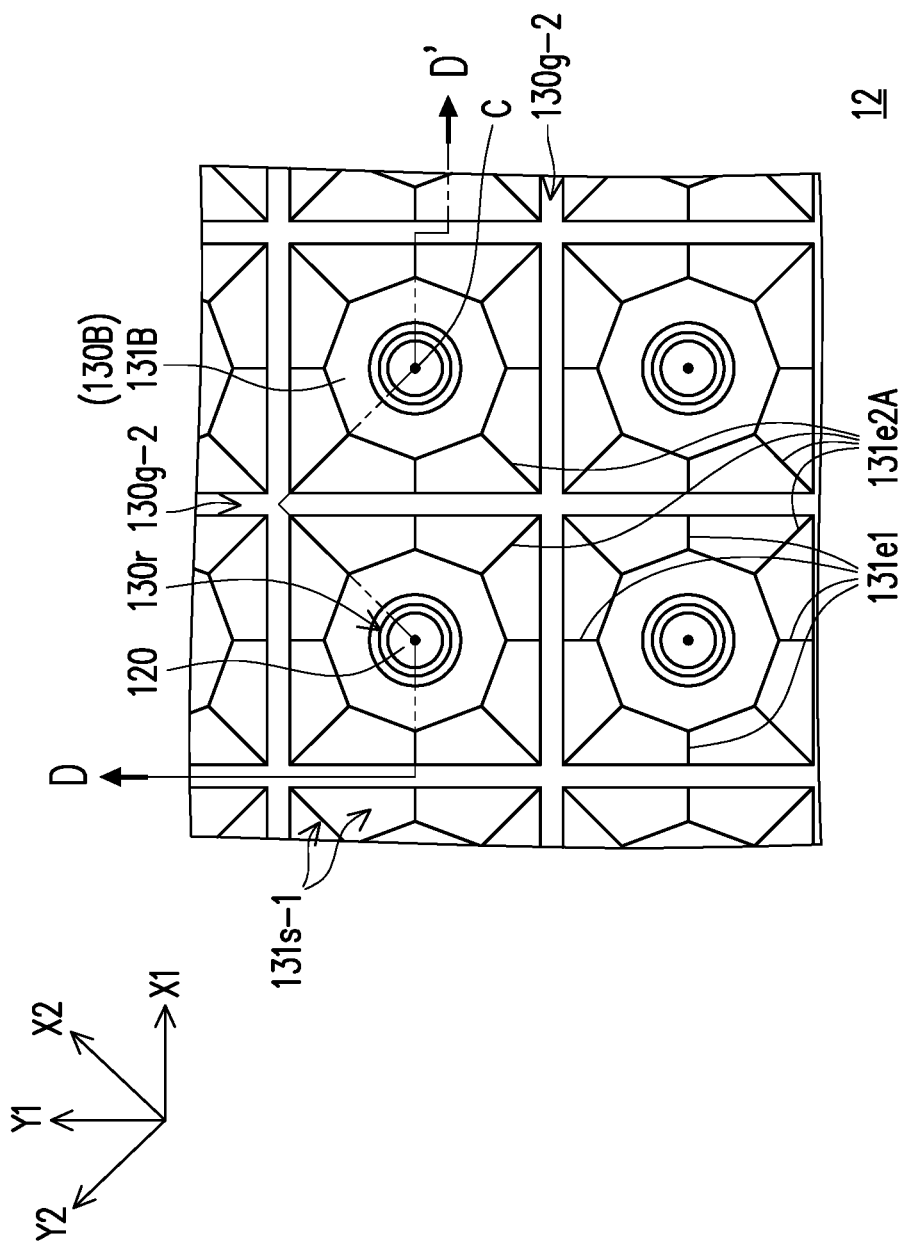
FIG. 6 is a schematic top view of a light source module according to the third embodiment of the disclosure.
Figure 7:
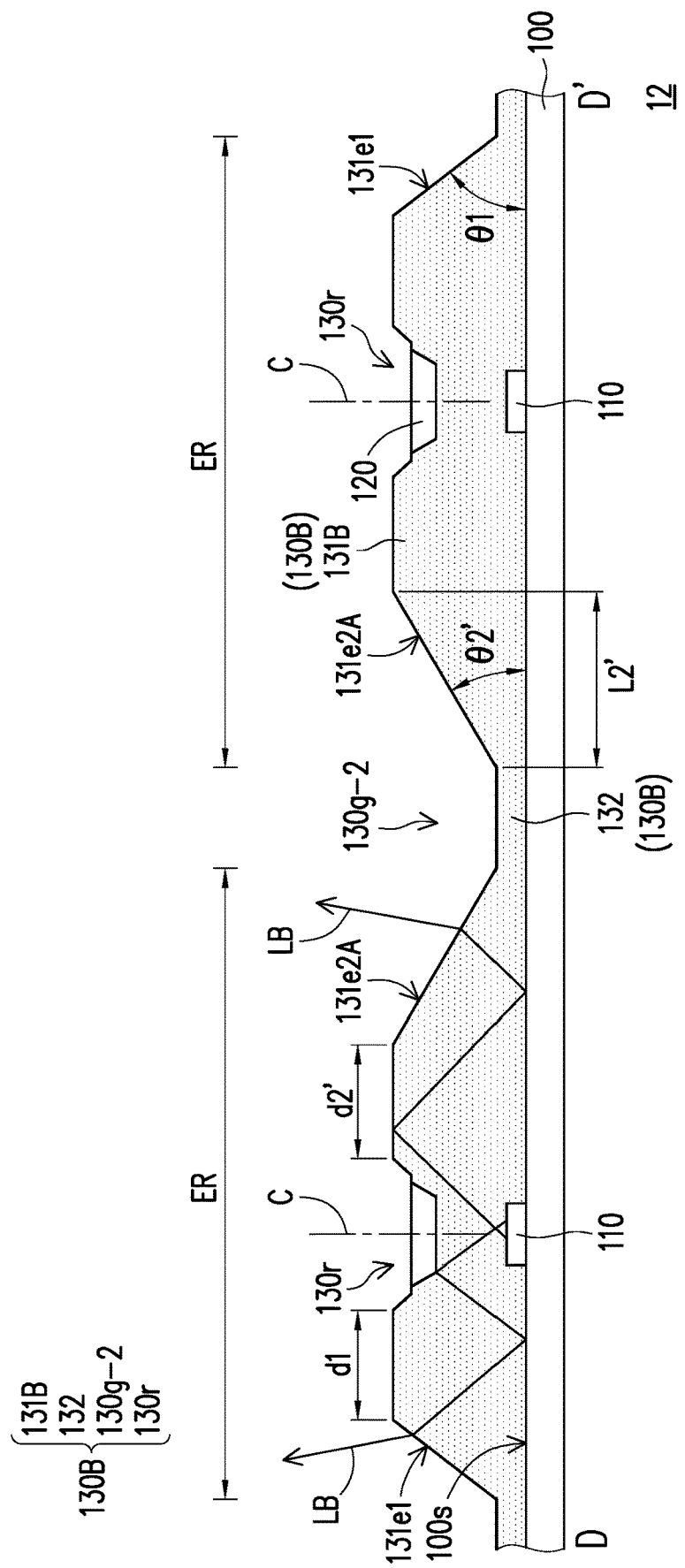
FIG. 7 is a schematic cross-sectional view of the light source module of FIG. 6 taken along a line D-D'.

FIG. 6 is a schematic top view of a light source module according to the third embodiment of the disclosure. FIG. 7 is a schematic cross-sectional view of the light source module of FIG. 6 taken along a line D-D'. In particular, the substrate 100 of FIG. 7 is omitted in FIG. 6. Referring to FIG. 6 and FIG. 7, the difference between a light source module 12 in the embodiment and the light source module 10 of FIG. 1 is that the structure of the main portion is different. Specifically, a length L2' of the orthogonal projection of a second inclined ridge 131e2A of a main portion 131B of an encapsulation layer 130B on the surface 100s of the substrate 100 is greater than the length L2 of the orthogonal projection of the second inclined ridge 131e2 of the main portion 131 of the encapsulation layer 130 on the surface 100s of the substrate 100 in FIG. 3.

In the embodiment, a distance d2' in the direction X2 (or direction Y2) between the end of the second inclined ridge 131e2A away from the substrate 100 (or a first groove 130g-2) and the second groove 130r is substantially equal to the distance d1 in the direction X1 (or direction Y1) between the end of the first inclined ridge 131e1 away from the substrate 100 (or the first groove 130g-2) and the second groove 130r, but the disclosure is not limited thereto. In another aspect, a second angle θ2' included between the second inclined ridge 131e2A and the surface 100s of the substrate 100 in the embodiment is less than the second angle θ2 included between the second inclined ridge 131e2 of the light source module 10 and the surface 100s of the substrate 100 in FIG. 3. Accordingly, the light uniformity of the light source module 12 can be further facilitated.

In the embodiment, the first inclined ridge 131e1, the second inclined ridge 131e2A, and an inclined surface 131s-1 connected between the first inclined ridge 131e1 and the second inclined ridge 131e2A of the main portion 131B are similar to those of the main portion 131 of the light source module 10 in FIG. 1. Therefore, the detailed description of the first inclined ridge 131e, the second inclined ridge 131e2A, and the inclined surface 131s-1 of the main portion 131B has been set forth in the foregoing and will not be repeated here.

Figure 8:
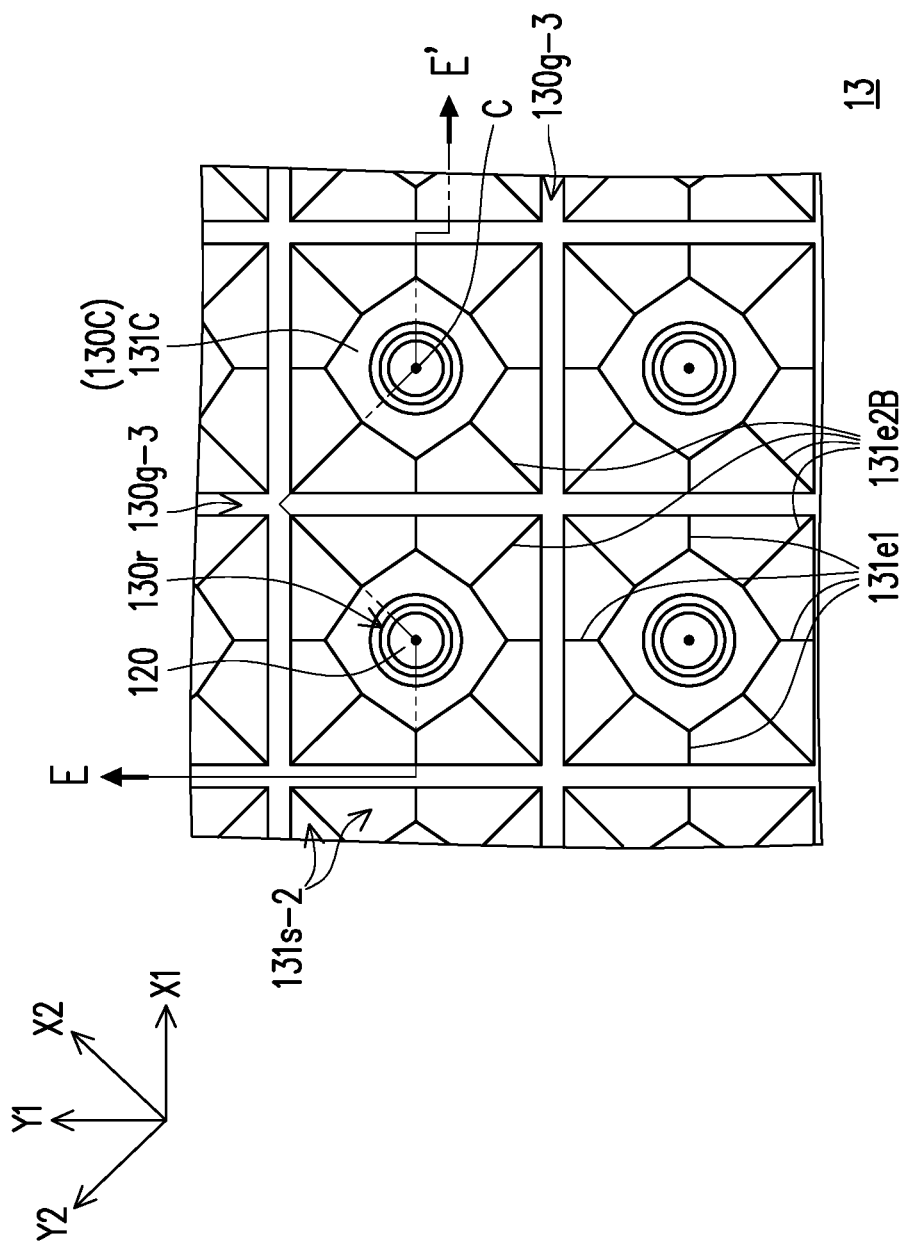
FIG. 8 is a schematic top view of a light source module according to the fourth embodiment of the disclosure.
Figure 9:
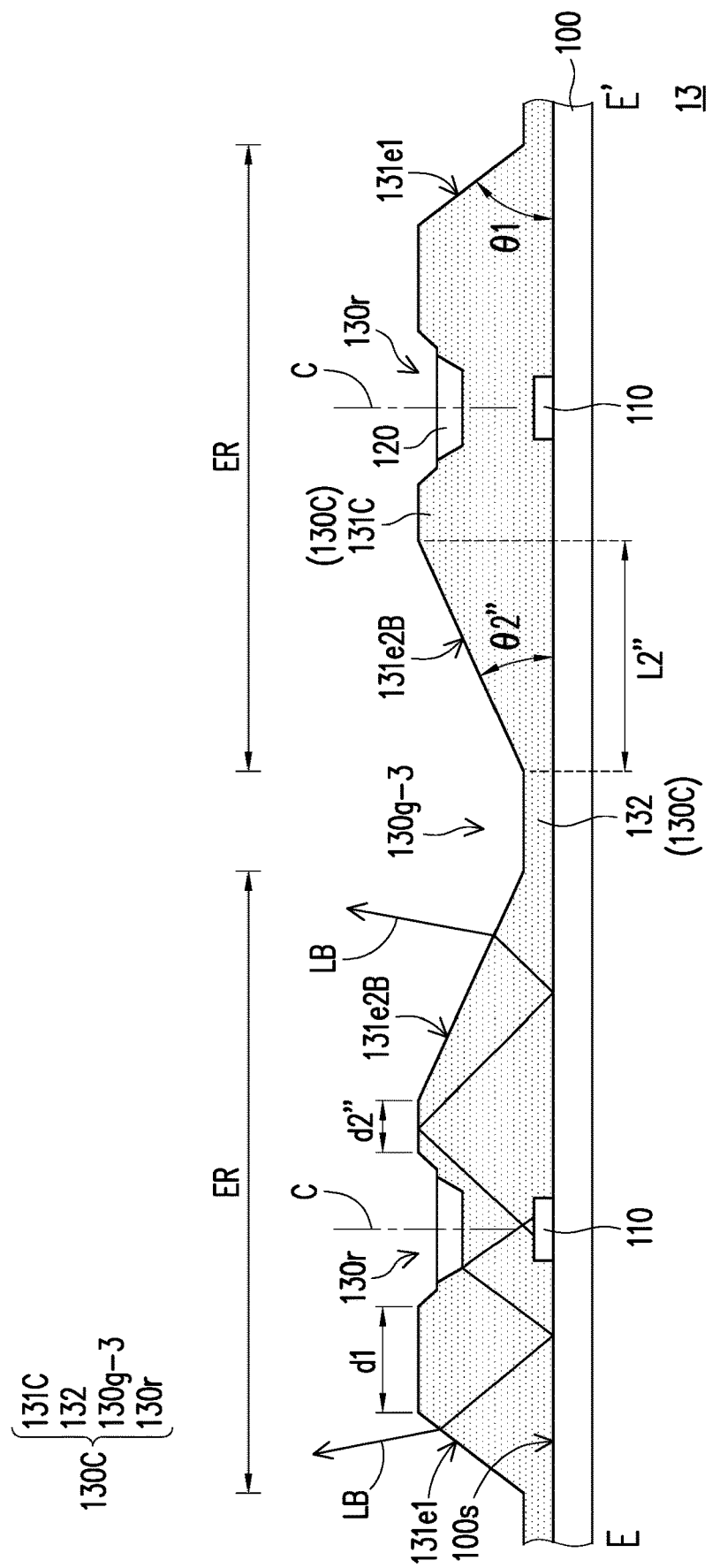
FIG. 9 is a schematic cross-sectional view of the light source module of FIG. 8 taken along a line E-E'.

FIG. 8 is a schematic top view of a light source module according to the fourth embodiment of the disclosure. FIG. 9 is a schematic cross-sectional view of the light source module of FIG. 8 taken along a line E-E'. In particular, the substrate 100 of FIG. 9 is omitted in FIG. 8. Referring to FIG. 8 and FIG. 9, the difference between a light source module 13 in the embodiment and the light source module 12 of FIG. 6 is that the structure of the main portion is different. Specifically, a length L2" of the orthogonal projection of a second inclined ridge 131e2B of a main portion 131C of an encapsulation layer 130C on the surface 100s of the substrate 100 is greater than the length L2' of the orthogonal projection of the second inclined ridge 131e2A of the main portion 131B of the encapsulation layer 130B on the surface 100s of the substrate 100 in the FIG. 6.

In the embodiment, the distance d1 in the direction X1 (or direction Y1) between the end of the first inclined ridge 131e1 away from the substrate 100 (or the first groove 130g-3) and the second groove 130r is greater than a distance d2" in the direction X2 (or direction Y2) between the end of the first inclined ridge 131e1 away from the substrate 100 (or a first groove 130g-3) and the second groove 130r, but the disclosure is not limited thereto. In another aspect, a second angle θ2" included between the second inclined ridge 131e2B and the surface 100s of the substrate 100 in the embodiment is less than the second angle θ2' included between the second inclined ridge 131e2A of the light source module 12 and the surface 100s of the substrate 100 in FIG. 7. Accordingly, the light uniformity of the light source module 13 can be further facilitated.

In the embodiment, the first inclined ridge 131e1, the second inclined ridge 131e2B, and the inclined surface 131s-2 connected between the first inclined ridge 131e1 and the second inclined ridge 131e2B of the main portion 131C are similar to those of the main portion 131 of the light source module 10 in FIG. 1. Therefore, the detailed description of the first inclined ridge 131e, the second inclined ridge 131e2B, and the inclined surface 131s-2 of the main portion 131C has been set forth in the foregoing and will not be repeated here.

Figure 10:
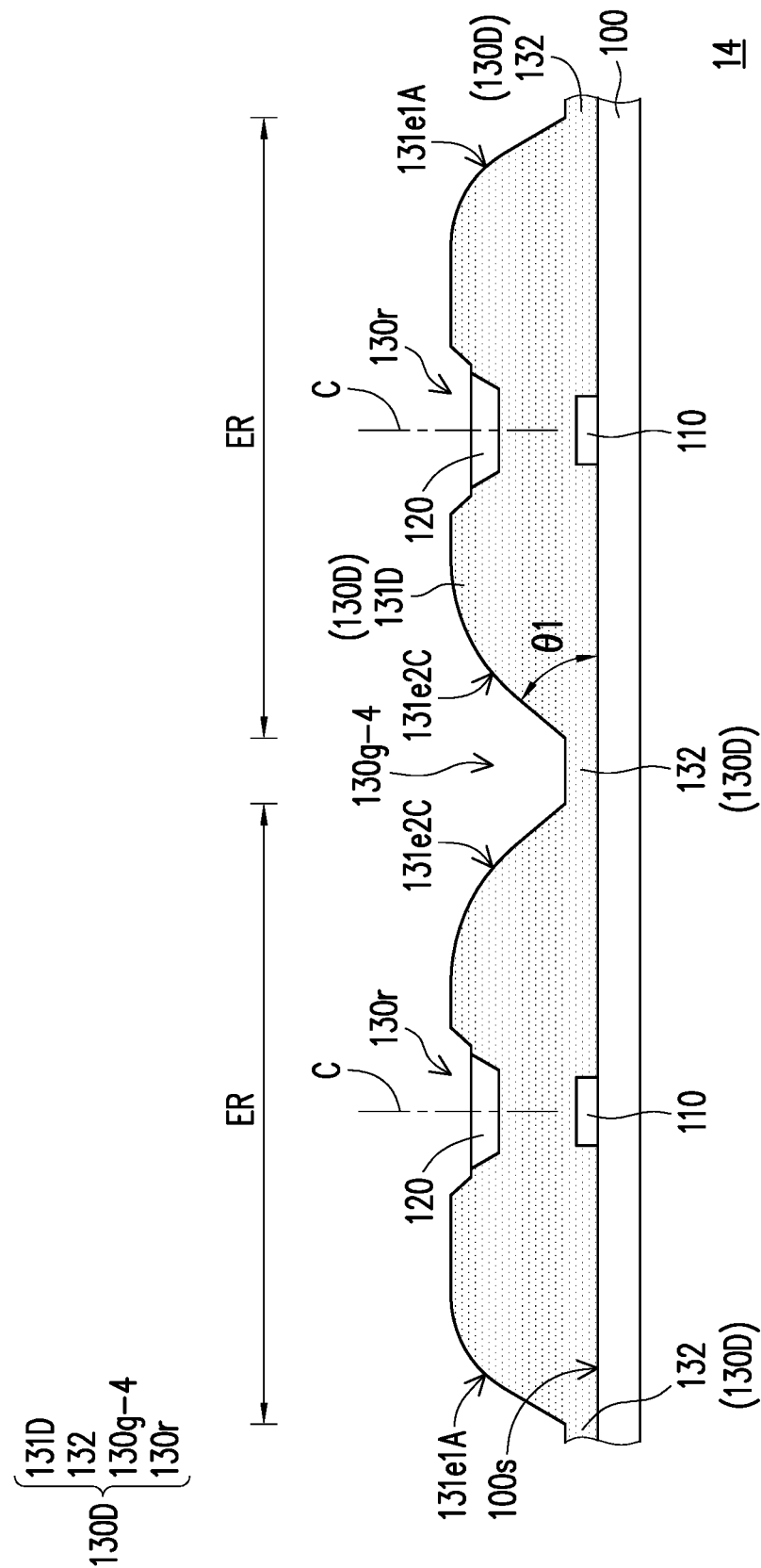
FIG. 10 is a schematic cross-sectional view of a light source module according to the fifth embodiment of the disclosure.

FIG. 10 is a schematic cross-sectional view of a light source module according to the fifth embodiment of the disclosure. Referring to FIG. 10, the difference between a light source module 14 in the embodiment and the light source module 10 of FIG. 2 is that the structure of the main portion is different. Specifically, the inclined ridges (e.g., a first inclined ridge 131e1A and a second inclined ridge 131e2C) of a main portion 131D of an encapsulation layer 130D have a curved segment. That is, in the embodiment, it is defined that the inclined surface (not shown) connected between a first groove 130g-4 and the inclined ridges may be a curved surface. However, the disclosure is not limited thereto. According to other embodiments, one of the first inclined ridge and the second inclined ridge may have a curved segment, and the other of the first inclined ridge and the second inclined ridge may not have a curved segment.

It should be noted that the curve segment of the inclined ridges shown in FIG. 10 is for illustration only, and the disclosure shall not be construed as being limited to such illustration. In other embodiments, the shape of the inclined ridges may also be a shape combining multiple line segments (e.g., polygonal-shaped line), a combination of multiple curved segments with different curvatures, or a combination of the foregoing.

Based on the above, in the light source module of an embodiment according to the disclosure, the main portion of the encapsulation layer is disposed between the light-emitting element and the reflecting element, and the light-emitting element and the reflecting element are disposed in the central position of the main portion. With the plurality of first inclined ridges around the central position of the main portion and the angle formed between the first inclined ridge and the surface of the substrate being less than 90 degrees, the light emitted by the light-emitting elements can be prevented from being laterally transmitted from the predetermined light emitting area to another main portion (or another light-emitting element), which results in overlapping with the light emitting area of the another main portion (or another light emitting element). Accordingly, the edge halo effect generated on the periphery of the light emitting area can be suppressed. In other words, the light uniformity of each main portion of the light source module is improved, and, as a result, the image contrast of the display device including the light source module is also facilitated.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may use "first", "second", etc. followed with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

What is claimed is:

1. A light source module, comprising a substrate, a plurality of light-emitting elements, a plurality of reflecting elements, and an encapsulation layer, wherein:
   the plurality of light-emitting elements are disposed on a surface of the substrate;
   the plurality of reflecting elements are respectively overlapped with the plurality of light-emitting elements in a direction perpendicular to the surface of the substrate; and
   the encapsulation layer is disposed between the plurality of reflecting elements and the plurality of light-emitting elements and comprises a plurality of first grooves and a plurality of main portions, wherein
      the plurality of first grooves are located between the plurality of light-emitting elements, and the plurality of first grooves are connected to each other, and
      the plurality of main portions cover the plurality of light-emitting elements, the reflecting element and the light-emitting element are disposed in a central position of the main portion, and the main portion has a plurality of first inclined ridges disposed around the central position to define the plurality of first grooves in a first direction, wherein the first direction is parallel to an extending direction of the surface of the substrate, a first angle is included between the first inclined ridge and the surface of the substrate, and the first angle is less than 90 degrees, wherein the plurality of main portions further comprise a plurality of second inclined ridges disposed around the central position to define the plurality of first grooves in a second direction, a second angle is included between the second inclined ridge and the surface of the substrate, and the second angle is less than 90 degrees and is not equal to the first angle,
      wherein the first direction and the second direction intersect each other and are parallel to the surface of the substrate.

2. The light source module of claim 1, wherein the first angle is less than 30 degrees.

3. The light source module of claim 1, wherein the encapsulation layer further comprises a plurality of connections, wherein
   the plurality of connections are stacked with respect to the plurality of first grooves in the direction perpendicular to the surface of the substrate and connected between the plurality of main portions, wherein a thickness of the main portion in the direction perpendicular to the surface of the substrate is at least three times greater than a thickness of the connection in the direction perpendicular to the surface of the substrate.

4. The light source module of claim 1, wherein the first inclined ridge has a curved segment.

5. The light source module of claim 1, wherein the encapsulation layer further comprises a plurality of second grooves stacked with respect to the plurality of light-emitting elements in the direction perpendicular to the surface of the substrate respectively and the plurality of reflecting elements are respectively located in the plurality of second grooves.

6. The light source module of claim 5, wherein the reflecting element has a plurality of reflecting particles.

7. The light source module of claim 1, wherein the main portion further comprises a plurality of inclined surfaces, the first inclined ridge and the second inclined ridge are located on opposite sides of the inclined surface respectively, and the plurality of inclined surfaces are not coplanar with each other.

8. The light source module of claim 7, wherein in the direction perpendicular to the surface of the substrate, the first inclined ridge and the second inclined ridge are axes of symmetry of the main portion.

9. The light source module of claim 7, wherein the main portion has a first width in the first direction, the main portion has a second width in the second direction, and the first width is less than the second width.

10. The light source module of claim 9, wherein a length of an orthogonal projection of the first inclined ridge on the surface of the substrate is not equal to a length of an orthogonal projection of the second inclined ridge on the surface of the substrate.

11. The light source module of claim 9, wherein the second angle is less than the first angle.

* * * * *